(12) United States Patent
Wu et al.

(10) Patent No.: US 7,436,667 B2
(45) Date of Patent: Oct. 14, 2008

(54) ELECTRONIC DEVICE

(75) Inventors: Chun-Chieh Wu, Taipei (TW);
Hung-Chun Chu, Taipei (TW);
Hsi-Feng Lin, Taipei (TW)

(73) Assignee: Asustek Computer, Inc., Taipei (TW)

( * ) Notice: Subject to any disclaimer, the term of this patent is extended or adjusted under 35 U.S.C. 154(b) by 35 days.

(21) Appl. No.: 11/545,419

(22) Filed: Oct. 11, 2006

(65) Prior Publication Data

US 2007/0217156 A1    Sep. 20, 2007

(30) Foreign Application Priority Data

Mar. 15, 2006   (TW) ............................. 95108776 A

(51) Int. Cl.
*H05K 7/20* (2006.01)
*F28F 7/00* (2006.01)
(52) U.S. Cl. ................. 361/700; 165/80.3; 165/104.33; 165/121; 361/697
(58) Field of Classification Search ................. 361/700
See application file for complete search history.

(56) References Cited

U.S. PATENT DOCUMENTS

| | | | |
|---|---|---|---|
| 6,452,797 B1 * | 9/2002 | Konstad | 361/695 |
| 6,671,177 B1 * | 12/2003 | Han | 361/719 |
| 6,937,474 B2 * | 8/2005 | Lee | 361/715 |
| 7,019,974 B2 * | 3/2006 | Lee et al. | 361/700 |
| 2002/0172008 A1 * | 11/2002 | Michael | 361/697 |
| 2003/0189815 A1 * | 10/2003 | Lee | 361/719 |
| 2004/0228093 A1 | 11/2004 | Lee | 361/701 |
| 2005/0061477 A1 * | 3/2005 | Mira | 165/80.3 |
| 2006/0164808 A1 | 7/2006 | Stefanoski | 361/700 |

FOREIGN PATENT DOCUMENTS

EP        0 489 326 A2    11/1991

* cited by examiner

*Primary Examiner*—Gregory D Thompson
(74) *Attorney, Agent, or Firm*—Bacon & Thomas, PLLC

(57) ABSTRACT

An electronic device has a first circuit board, a first fan, a second circuit board, a first heat sink, and a first air ventilation duct. The first fan and the first circuit board are electrically connected together. The second circuit board is electrically connected to the first circuit board; the first heat sink is electrically connected to the second circuit board; and the first air ventilation duct is connected to the first fan and the first heat sink. The first heat sink introduce the heat generated by the electronic element on the second circuit board to the first fan for better cooling performance. Therefore, the present invention requires only the first fan and the second fan, but is able to provide high cooling efficiencies with a low noise signature.

9 Claims, 4 Drawing Sheets

ELECTRONIC DEVICE

BACKGROUND OF THE INVENTION

1. Field of the Invention

The present invention relates to an electronic device, and more particularly, to an electronic device with an air ventilation function which can direct heat to the fan vent.

2. Description of Related Art

Modern computer parts, such as CPUs, memory, display cards, etc have increasingly fast processing abilities. For display cards, display cards with higher speeds require more processing chips, and more processing chips means the generation of more heat during operation; therefore, if the cooling is not sufficient, the display card may be damaged by the heat.

Some prior art display cards that generate a great deal of heat come with an attached heat sink made of copper or aluminum. The heat from the card is transfer to the heat sink, which has a larger area, and the heat sink is air cooled. The cooling efficiency of this heat sink depends on the area of the heat sink and the speed of the air flow. However, the display cards are usually disposed on the motherboard with other interface cards, such as audio cards, network cards, and hard disk controllers, which impede the air flow. Moreover, as there is very limited space in the computer case, the area of the heat sink cannot be increased by too much. Therefore, the prior art heat sink is unable to provide adequate cooling.

Some prior art display cards utilize a forced-cooling method, which has both a heat sink and a fan for cooling, which provides a better cooling performance, but is also a source of noise.

Therefore, it is desirable to provide an electronic device with an air ventilation function to mitigate and/or obviate the aforementioned problems.

SUMMARY OF THE INVENTION

An electronic device comprises a first circuit board, a first fan, a second circuit board, a first heat sink, and a first air ventilation duct. The first fan and the first circuit board are electrically connected together. The second circuit board is electrically connected to the first circuit board. The first heat sink is electrically connected to the second circuit board, and the first air ventilation duct is connected to the first fan and the first heat sink.

The first heat sink induce the heat generated by the electronic element on the second circuit board to the first fan for better cooling performance. Therefore, the present invention requires only the first fan and the second fan, but is able to provide high cooling efficiencies with a low noise signature.

The first air ventilation duct comprises a first vent, a second vent, and a duct body. The duct body connected to the first vent and the second vent. The second vent connected to the first fan, and the first vent connected to the first heat sink. Furthermore, at least one part of the first heat sink is disposed in the first vent. Therefore, the heat generated by the second circuit board is conducted to the first vent of the first fan.

Furthermore, the present invention further comprises a first heat pipe, and a second heat sink. One end of the first heat pipe is fixed on the first heat sink, and another end is fixed on the second heat sink. The second heat sink increases the entire cooling surface area to increase the cooling capabilities.

One side of the first heat sink has a first connection, and the duct body of the first air ventilation duct has a second connection corresponding to the first connection. The first connection is a rounded post or other equivalent design, and the second connection is a through hole or other equivalent design. So the first heat sink can be fixed onto the first air ventilation duct.

The second heat sink comprises a base and a plurality of cooling fins. The plurality of cooling fins are arranged in parallel and connected to the base and used for increasing the entire cooling surface area to increase the cooling capabilities.

The present invention further comprises an electronic element. The electronic element is disposed on the second circuit board. The base is disposed on the second circuit board and contacts to the electronic element. The heat generated by the electronic element is conducted by the base to the second heat sink.

Moreover, the second circuit board can be a display card, or other interface card, and the first fan can be a CPU fan or a system fan.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
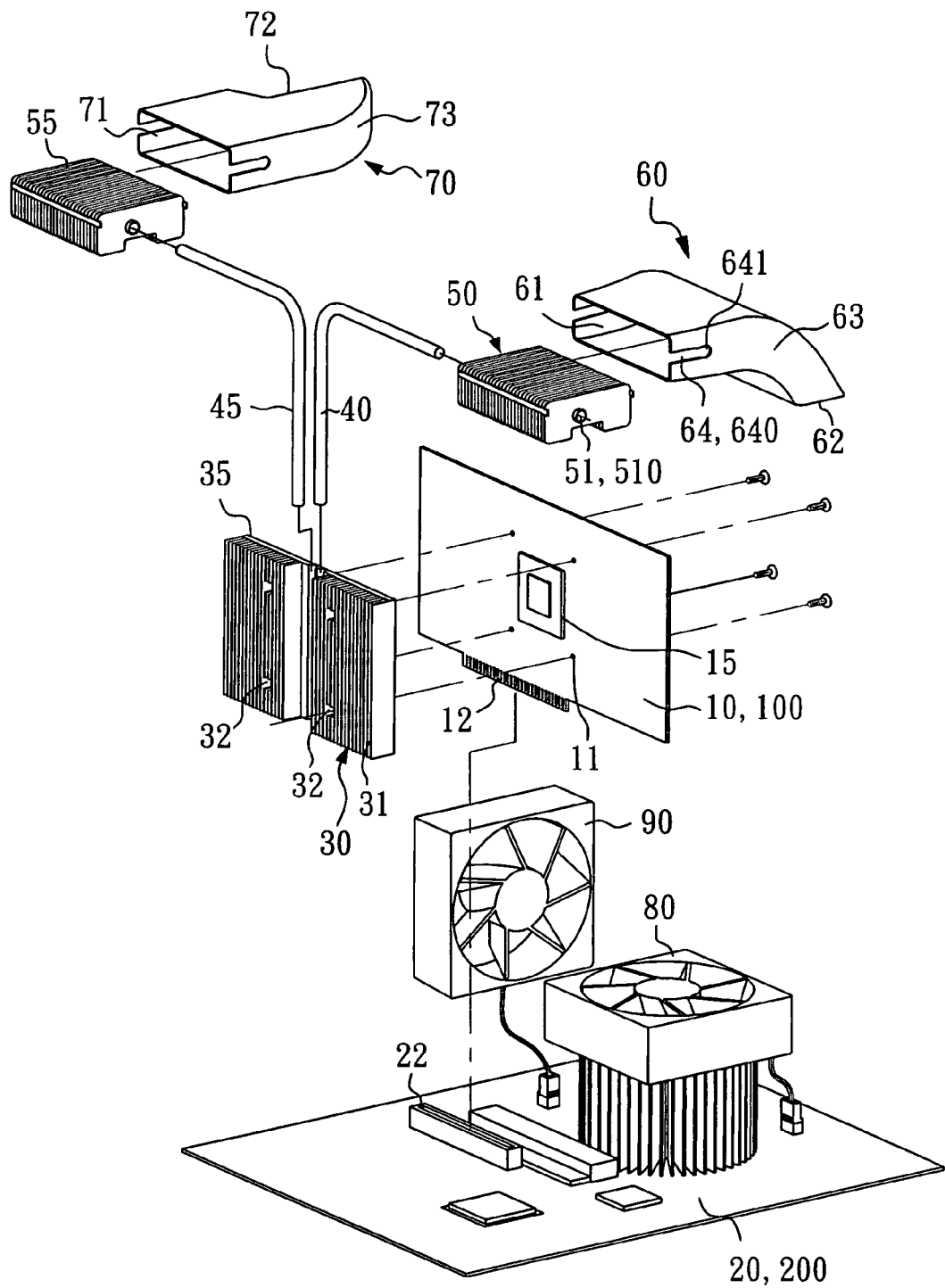
FIG. 1 is an exploded view of a preferred embodiment of the present invention.

Please refer to FIG. 1. FIG. 1 is an exploded view of a preferred embodiment of the present invention. The embodiment comprises a first circuit board 20, a second circuit board 10, an electronic element 15, a first heat pipe 40, a second heat pipe 45, a first heat sink 50, a second heat sink 30, a third heat sink 55, a first air ventilation duct 60, a second air ventilation duct 70, a first fan 80, and a second fan 90.

As shown in FIG. 1, the first fan 80 is electrically connected to the first circuit board 20, and the second circuit board 10 is inserted in a socket 22 on the first circuit board 20 via so-called golden fingers 12 and connected to the first circuit board 20. The second heat sink 30 has a base 35, four through holes 32, and a plurality of cooling fins 31; the plurality of cooling fins 31 are disposed in parallel and connected onto the base 35. The electronic element 15 is disposed on the second circuit board 10, and the second heat sink 30 utilizes those four through holes 32 and four corresponding through holes 11 on the second circuit board 10 to fix the base 35 onto the second circuit board 10; the base 35 contacts the electronic element 15 to conduct the heat generated by the electronic element 15 through the base 35 to the plurality of cooling fins 31 of the second heat sink 30. The plurality of cooling fins 31 are used to increase the entire cooling surface area of the second heat sink 30 to increase the cooling capabilities.

In this embodiment, the first circuit board 20 is a motherboard 200 of a computer host, the second circuit board 10 is a display card 100, and the electronic element 15 is a graphics chip.

As shown in FIG. 1, one end of the first heat pipe 40 is fixed onto the base 35 of the second heat sink 30, and another end of the first heat pipe 40 is fixed onto the first heat sink 50. The first air ventilation duct 60 comprises a first vent 61, a second vent 62, and a duct body 63. The duct body 63 is connected to the first vent 61 and the second vent 62; the second vent 62 is connected to the first fan 80, and the first vent 61 is connected to the first heat sink 50. In this embodiment, the first heat sink 50 are all disposed in the first vent 61, in order to introduce the heat generated by the electronic element 15 on the second circuit board 10 to the first fan 80 for better cooling performance.

The first heat sink 50 has a first connection 51 on its side, and the duct body 63 has a second connection 64 corresponding to the first connection 51, so the first heat sink 50 can be fixed onto the first air ventilation duct 60. In this embodiment, the first connection 51 of the first heat sink 50 is a post 510, and the second connection 64 of the duct body 63 is a slit 640 with a rounded edge 641 which can hook with the post 510 of the first heat sink 50.

As shown in FIG. 1, one end of the second heat pipe 45 is fixed onto the base 35 of the second heat sink 30, and another end of the second heat pipe 45 is fixed onto the third heat sink 55. The second air ventilation duct 70 also comprises a first vent 71, a second vent 72, and a duct body 73. The duct body 73 is connected to the first vent 71 and the second vent 72, and the second vent 72 is connected to the second fan 90. The second fan 90 is also electrically connected to the first circuit board 20, and the first vent 71 is connected to the third heat sink 55. In this embodiment, the third heat sink 55 is also disposed in the first vent 71 of the second air ventilation duct 70. The third heat sink 55 is used to increase the entire cooling surface area to increase the cooling performance. The assembly method for the third heat sink 55 and the second air ventilation duct 70 is identical to the connection between the first heat sink 50 and the first air ventilation duct 60.

Figure 2:
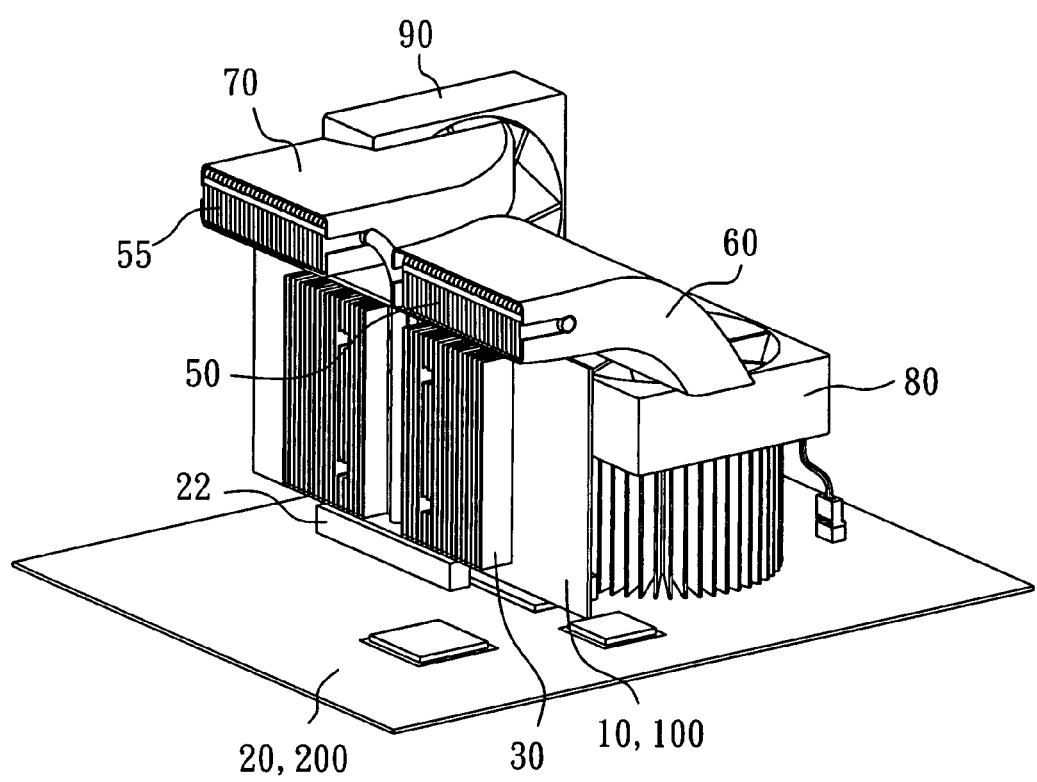
FIG. 2 is a perspective view of the preferred embodiment of the present invention.

Please refer to FIG. 2. FIG. 2 is a perspective view of the preferred embodiment of the present invention. In this embodiment, the first fan 80 is a CPU fan, and the second fan 90 is a fan for the host system.

Figure 3:
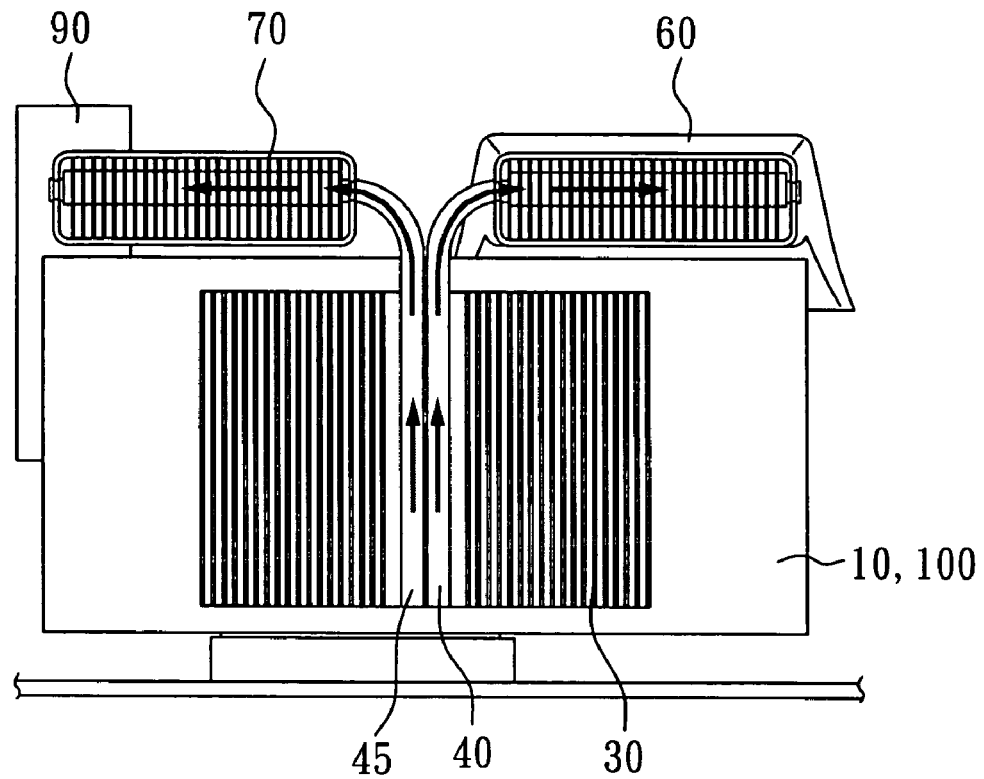
FIG. 3 is a schematic drawing of air ventilation cooling according to the preferred embodiment of the present invention.
Figure 4:
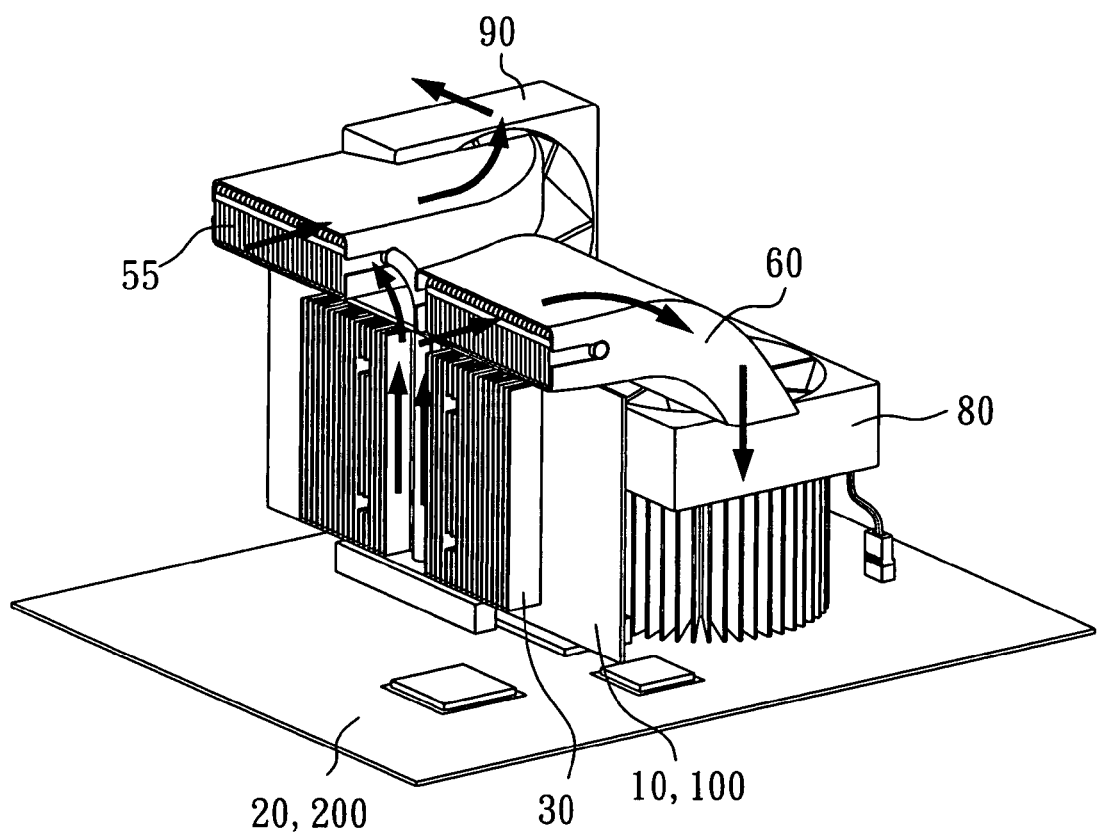
FIG. 4 is another schematic drawing of air ventilation cooling according to the preferred embodiment of the present invention.

Please refer to FIG. 3 and FIG. 4. FIG. 3 is a schematic drawing of air ventilation cooling according to the preferred embodiment of the present invention. FIG. 4 is another schematic drawing of air ventilation cooling according to the preferred embodiment of the present invention. The second heat sink 30 accepts heat from the electronic element 15 of the second circuit board 10 and uses the first heat pipe 40 and the second heat pipe 45 to transmit the heat to the first heat sink 50 and the third heat sink 55 to increase the entire cooling surface area and the cooling performance. Then, the first air ventilation duct 60 and the second air ventilation duct 70 induce the heat to the first fan 80 and the second fan 90 for forced cooling. Therefore, the present invention requires only the first fan 80 and the second fan 90, but is able to provide high cooling efficiencies with a low noise signature.

Although the present invention has been explained in relation to its preferred embodiment, it is to be understood that many other possible modifications and variations can be made without departing from the spirit and scope of the invention as hereinafter claimed.

What is claimed is:

1. An electronic device comprising:
    a first circuit board;
    a first fan electrically connected to the first circuit board;
    a second circuit board connected to the first circuit board;
    a first heat sink;
    a second heat sink;
    a first air ventilation duct connected to the first fan and the first heat sink; and
    a first heat pipe;
    wherein one end of the first heat pipe is fixed in the first heat sink, and another end of the first heat pipe is fixed in the second heat sink.

2. The electronic device as claimed in claim 1, wherein the first air ventilation duct comprises a first vent, a second vent, and a duct body, the duct body connected with the first vent and the second vent, the second vent connected to the first fan, and the first vent connected to the first heat sink.

3. The electronic device as claimed in claim 2, wherein at least one part of the first heat sink is disposed in the first vent.

4. The electronic device as claimed in claim 2, wherein one side of the first heat sink has a first connection, and the duct body has a second connection corresponding to the first connection.

5. The electronic device as claimed in claim 4, wherein the first connection is a post, the second connection is a slit.

6. The electronic device as claimed in claim 1, wherein the second heat sink comprises a base and a plurality of cooling fins, the plurality of cooling fins are arranged in parallel and connected to the base.

7. The electronic device as claimed in claim 6 further comprising an electronic element, the electronic element disposed on the second circuit board, the base is disposed on the second circuit board and contacts the electronic element.

8. The electronic device as claimed in claim 1, wherein the second circuit board is a display card, and the first fan is a CPU fan.

9. The electronic device as claimed in claim 1, wherein the first fan is a system fan.

* * * * *